United States Patent
Hsiang et al.

(10) Patent No.: US 6,650,701 B1
(45) Date of Patent: Nov. 18, 2003

(54) APPARATUS AND METHOD FOR CONTROLLING AN ACOUSTIC ECHO CANCELER

(75) Inventors: Peter C. Hsiang, Cupertino, CA (US); James H. Parry, Los Gatos, CA (US)

(73) Assignee: VTEL Corporation, Austin, TX (US)

(*) Notice: Subject to any disclaimer, the term of this patent is extended or adjusted under 35 U.S.C. 154(b) by 0 days.

(21) Appl. No.: 09/483,601

(22) Filed: Jan. 14, 2000

(51) Int. Cl.$^7$ .................................................. H03H 7/30
(52) U.S. Cl. ...................................... 375/232; 375/285
(58) Field of Search ......................... 375/232, 240.02, 375/240.12, 240.15, 240.05, 240.29, 350, 351, 284, 285, 278, 296, 346; 370/286, 287, 288, 289, 290, 291; 379/406, 410, 387–392, 416, 420.01

(56) References Cited

U.S. PATENT DOCUMENTS

| | | | |
|---|---|---|---|
| 4,965,822 A | 10/1990 | Williams | 379/390 |
| 5,533,121 A * | 7/1996 | Suzuki et al. | 370/286 |
| 5,631,900 A * | 5/1997 | McCaslin et al. | 370/287 |
| 5,646,991 A * | 7/1997 | Sih | 379/286 |
| 5,796,820 A * | 8/1998 | Sasada | |
| 6,044,068 A * | 3/2000 | El Malki | 370/286 |
| 6,049,606 A * | 4/2000 | Ding et al. | 379/406 |
| 6,058,194 A * | 5/2000 | Gulli et al. | 381/72 |
| 6,108,413 A * | 8/2000 | Capman et al. | 379/410 |
| 6,125,179 A * | 9/2000 | Wu | 379/388 |
| 6,141,415 A * | 10/2000 | Rao | 379/410 |
| 6,192,126 B1 * | 2/2001 | Koski | 379/406.14 |
| 6,201,866 B1 * | 3/2001 | Ariyama et al. | 379/410 |
| 6,212,273 B1 * | 4/2001 | Hemkumar et al. | 379/392 |
| 6,243,462 B1 * | 6/2001 | Chujo et al. | 379/406.1 |
| 6,269,161 B1 * | 7/2001 | McLaughlin et al. | 379/406 |
| 6,282,176 B1 * | 8/2001 | Hemkumar | 370/276 |
| 6,330,336 B1 * | 12/2001 | Kasama | 381/71.1 |
| 6,434,110 B1 * | 8/2002 | Hemkumar | 370/201 |
| 6,438,225 B1 * | 8/2002 | Tahernezhaadi | 379/406.1 |

OTHER PUBLICATIONS

Breining, Christina et al., "Acoustic Echo Control—An Application of Very–High–Order Adaptive Filters", IEEE Signal Processing, Jul., 1999, pp. 42–69.

Chen, Jiande et al., "A New Structure For Sub–Band Acoustic Echo Cancelers", CH2561–9/88/0000–2574, IEEE, 1988, pp. 2574–2577.

Gilloire, Andre, "Experiments With Sub–Band Acoustic Echo Cancellers For Teleconferencing", CH2396 0/87/0000–2141, IEEE, 1987, pp. 2141–2144.

* cited by examiner

*Primary Examiner*—Emmanuel Bayard
(74) *Attorney, Agent, or Firm*—Hamilton & Terrile, LLP; Robert W. Holland

(57) ABSTRACT

A method and associated apparatus for controlling an acoustic canceler ("AEC") are disclosed. Prior to passing audio signals to the AEC, a distortion detector is used to determine if the signals are distorted. If so, the AEC does not adapt is filter coefficients to the distorted signals. This technique improves the AEC's ability to adapt its filter coefficients to subsequent undistorted signals. For example, near-end or far-end audio signals above a predetermined threshold value are detected by a distortion detector which disables adaptive filter control logic so that distorted signals do not result in generation of erroneous filter coefficients.

19 Claims, 3 Drawing Sheets

APPARATUS AND METHOD FOR CONTROLLING AN ACOUSTIC ECHO CANCELER

BACKGROUND

1. Field of the Invention

The present invention generally relates to telecommunication systems and more particularly to acoustic echo cancellation.

2. Description of the Related Art

In telecommunication systems (e.g. telephony and video conferencing systems), audio signals such as a user's voice are transmitted to a loudspeaker in a remote location using a microphone. A microphone and a loudspeaker are provided at each location for sending and receiving audio signals. Acoustic coupling occurs in these systems whenever a microphone is placed where it can pick up the sounds from a loudspeaker in the same location. In which case, the user's voice is transmitted to a loudspeaker in a remote location, picked up by a microphone in the remote location, and re-transmitted back to the loudspeaker in the user's location, thereby resulting in the user hearing back his own voice (i.e. an echo). Acoustic coupling between microphones and loudspeakers is difficult to eliminate because microphones and loudspeakers are typically located in the same general area, such as in a conference room or a large hall.

Acoustic Echo Cancelers("AEC") have been developed to eliminate echoes caused by acoustic coupling. AECs, in general, are well known; see for example: U.S. Pat. No. 4,965,822 (Williams); H. Yasukawa et al., "Acoustic Echo Canceler with High Speech Quality," Institute of Electrical and Electronic Engineers ("IEEE") CH2396-0/87/0000-2125 (1987); A. Gilloire, "Experiments With Sub-Band Acoustic Echo Cancelers For Teleconferencing," IEEE CH2396-0/87/0000-2141 (1987); J. Chen et al., "A New Structure For Sub-Band Acoustic Echo Canceler," IEEE CH2561-9/88/0000-2574 (1988); and C. Breining et al., "Acoustic Echo Control: An Application of Very-High Order Adaptive Filters," IEEE Signal Processing Magazine 1053-5888/99, pp. 42–69 (1999). All of the aforementioned references are incorporated herein by reference.

A typical AEC uses an adaptive filter to generate an echo estimate signal that is subtracted from the microphone's output signal. If the echo estimate signal matches the echo embedded in the microphone's output signal, the echo is canceled out (i.e. removed). The accuracy of the generated echo estimate signal is dependent on the AEC's capability to change the coefficients of its adaptive filter to adapt to the echo. Thus, improving the capability of AECs to adapt to echoes is highly desirable.

SUMMARY OF THE INVENTION

The present invention relates to a method and associated apparatus for controlling an AEC. In one embodiment, distortion detectors are used to determine if an audio signal is distorted. If so, the AEC is prevented from incorrectly adapting its filter coefficients to the distorted audio signal. This allows the AEC to maintain a valid set of filter coefficients that can be rapidly adapted to cancel subsequent echoes.

DETAILED DESCRIPTION

The present invention relates to a method and associated apparatus for controlling an acoustic echo canceler ("AEC"). The invention can be used with a variety of AECs including full-band, sub-band, finite impulse response ("FIR"), and infinite impulse response ("IIR") AECs.

Figure 1:
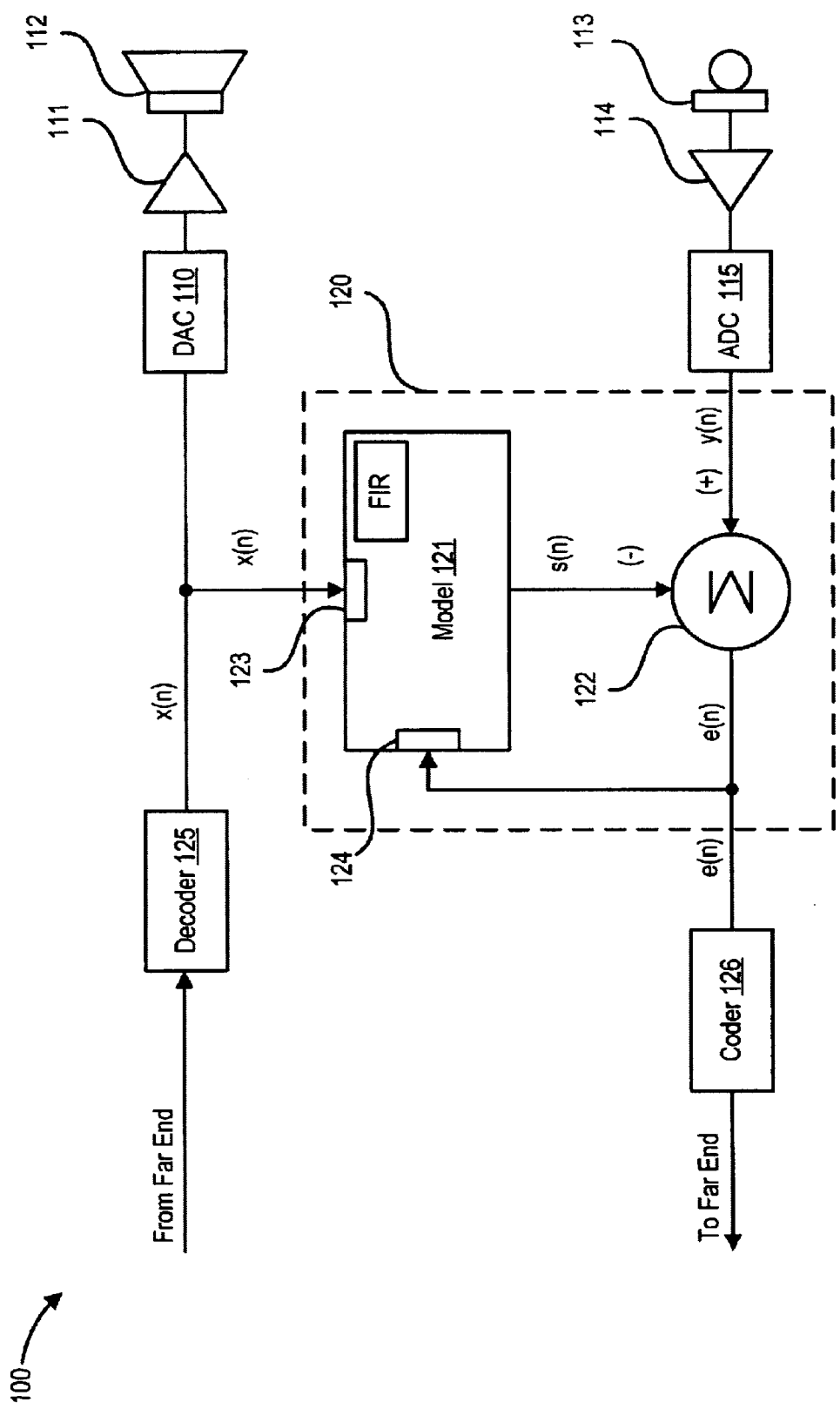
FIG. 1 shows a block diagram of an audio transmission system in the prior art.

FIG. 1 shows a block diagram of an audio transmission system 100 in the prior art. A digital audio signal from a remote location (also referred to as the "far-end") is converted into a format that is compatible with system 100 by decoder 125. The resulting digital audio signal x(n) (also referred to as the "far-end signal") is converted to an analog signal by a digital-to-analog converter DAC 110, amplified by an amplifier 111, and then converted into sound by a loudspeaker 112. If a microphone 113 and loudspeaker 112 are placed in the same general area, far-end signal x(n) can be picked up by microphone 113 from loudspeaker 112, amplified by an amplifier 114, converted to a digital signal by an analog-to-digital converter ADC 115, converted to a format that is compatible with an audio transmission system in the far-end by coder 126, and then heard back in the far-end as an echo. The location of microphone 113 and loudspeaker 112 is hereinafter referred to as the "near-end."

In system 100, an AEC 120 is employed to prevent echoes from being transmitted to the far-end. A model 121 includes an adaptive filter, such as a finite impulse response ("FIR") filter, for generating an echo estimate signal s(n). The use of adaptive filters in AECs is well known. Echoes are canceled by subtracting echo estimate signal s(n) from the output signal of microphone 113. For example, when the user in the far-end is talking while the user in the near-end is listening, AEC 120 will detect that there is audio activity in the far-end. A microphone signal y(n), the digitized output of microphone 113, will contain some amount of the far-end audio due to acoustic coupling. Consequently, an adder 122 subtracts echo estimate signal s(n) from microphone signal y(n). If echo estimate signal s(n) accurately characterizes microphone signal y(n), a resulting error signal e(n) of adder 122 is zero. Otherwise, error signal e(n) will have some residual value that will be heard in the far-end as an echo. Error signal e(n) is fed back to an input port 124 of model 121 to provide an indication of how well the echo is canceled. Model 121 changes its adaptive filter's coefficients to adapt to the echo based on, among other criteria, samples of far-end signal x(n) taken at an input port 123 and samples of error signal e(n) taken at input port 124.

Generation of an accurate echo estimate signal s(n) depends on how correctly model 121 adapts its filter coefficients to the echo. As implemented in audio transmission system 100, model 121 adapts its filter coefficients even if far-end signal x(n) or microphone signal y(n) is distorted. For example, loud noises, such as door slams or noises created by physically moving a microphone, can saturate ADC 115 (i.e. require ADC 115 to operate beyond its allowable range of values) and result in a distorted microphone signal y(n). Because model 121 generates echo estimate signal s(n) based on the assumption that microphone signal y(n) resembles far-end signal x(n), a distorted microphone signal y(n) not only results in a large error signal e(n)

that is heard in the far-end, but also causes model 121 to incorrectly adapt its filter coefficients. Models with incorrectly adapted filter coefficients take a long time to re-train for subsequent echoes. Thus, it will take several iterations of echo cancellation before model 121 generates an accurate echo estimate signal s(n), thereby degrading the capability of AEC 120 to cancel echoes for a period of time. Also, if error signal e(n) is large enough, signals (not shown) in the far-end will saturate, further distorting error signal e(n), which is propagated back to the near-end. This echo cycle will continue until the loudspeaker volume or the microphone sensitivity at either the far-end or near-end is reduced.

Figure 2:
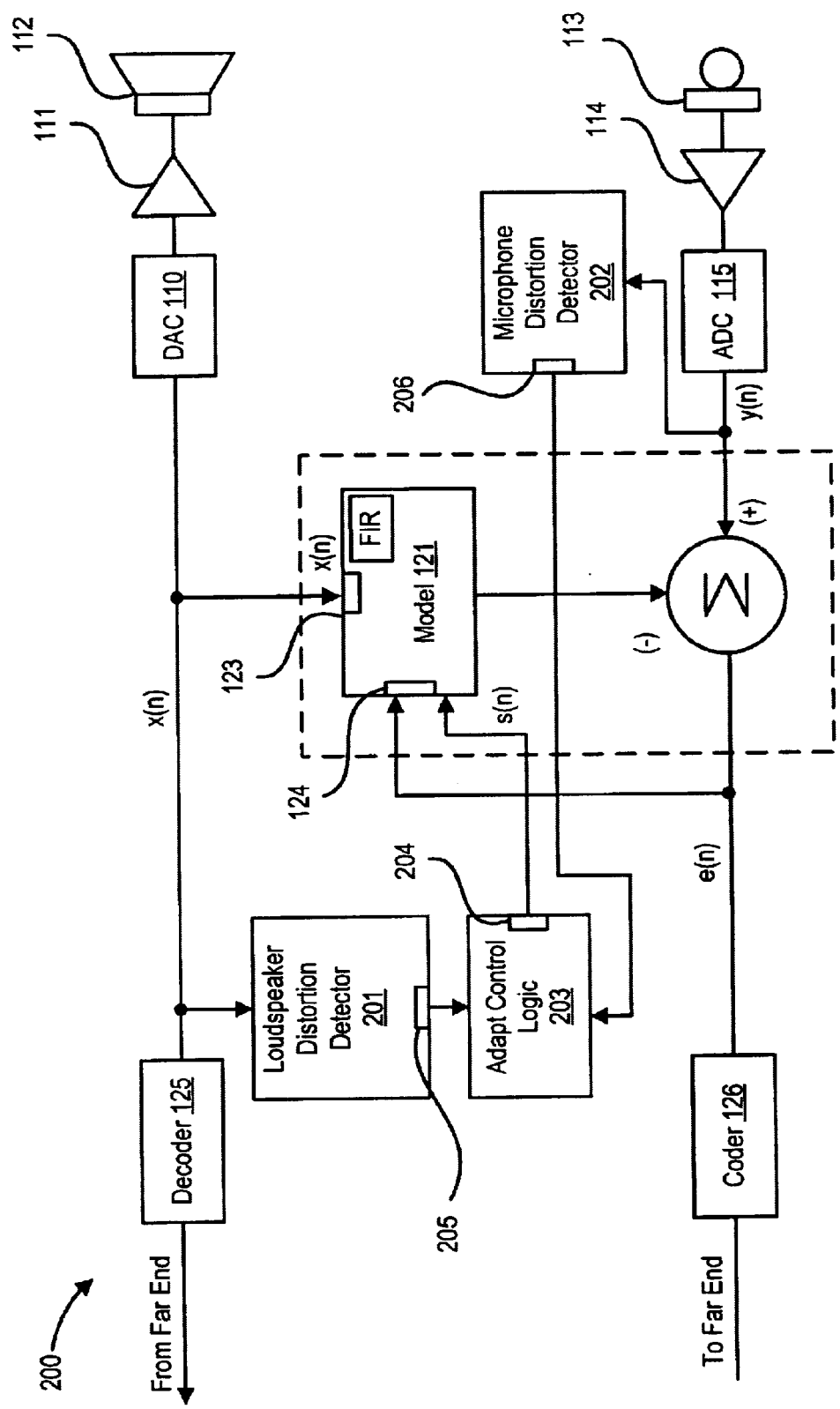
FIG. 2 shows a block diagram of an audio transmission system in accordance with an embodiment of the present invention.

FIG. 2 shows a block diagram of an audio transmission system 200 in accordance with an embodiment of the invention. Except for the addition of a loudspeaker distortion detector 201, a microphone distortion detector 202, and an adapt control logic 203, transmission system 200 is essentially identical to transmission system 100. Loudspeaker distortion detector 201 determines whether far-end signal x(n) will be distorted upon being converted by DAC 110, amplified by amplifier 111, and vocalized by loudspeaker 112. This determination can be based on known performance characteristics of DAC 110, amplifier 111, and loudspeaker 112. For example, if far-end signal x(n) has a decimal value of +21,000 (on a full scale range of +32,767 to −32,768) and it is known that far-end signals x(n) having a decimal value greater than +20,000 or less than −20,000 will be distorted, loudspeaker distortion detector 201 generates a logical HIGH signal on an output port 205 to indicate to an adapt control logic 203 that far-end signal x(n) will be distorted. Microphone distortion detector 202 determines whether microphone signal y(n) is a distorted representation of the sound pressure picked up by microphone 113. Such distortion can be due to the limited numerical range of ADC 115 or limitations in the performance characteristics of amplifier 114 and microphone 113. For example, if ADC 115 is saturated, microphone distortion detector 202 generates a logical HIGH signal on an output port 206 to inform adapt control logic 203 that microphone signal y(n) is distorted. A sequence of large sample values of microphone signal y(n) also indicates that microphone signal y(n) is distorted and, accordingly, causes microphone distortion detector 202 to generate a logical HIGH signal.

Adapt control logic 203 includes an output port 204 for controlling filter coefficient adaptation at model 121. If adapt control logic 203 detects a logical HIGH signal on output port 205 or on output port 206, a logical HIGH signal is generated on output port 204 to indicate to model 121 that either far-end signal x(n) or microphone signal y(n) is distorted and, therefore, not suitable for adaptation. Accordingly, model 121 does not adapt and retains its existing set of filter coefficients. As a result, model 121 retains a valid set of filter coefficients that can be more rapidly adapted to cancel subsequent echoes. In the case where both output ports 205 and 206 are at a logical LOW, adapt control logic 203 generates a logical LOW signal on output port 204 to indicate that there is no distortion. Model 121 then uses well known adaptation rules, such as not adapting when there is audio activity in both the far-end and the near-end, in determining whether to adapt its filter coefficients. In other words, the signal on output port 204 of control logic 203 can be used as a gate or a condition precedent to conventional adaptation rules.

While the above embodiment of the invention is described using two distortion detectors, the invention is not so limited. For example, the invention can be used with a loudspeaker distortion detector 201 but without a microphone distortion detector 202, and vice versa. This configuration simplifies implementation and may be adequate for some applications. Further, the output of loudspeaker distortion detector 201 or microphone distortion detector 202 can be directly connected to model 121 without going to a separate adapt control logic 203. In which case, model 121 adapts its filter coefficients based on information directly received from loudspeaker distortion detector 201 or microphone distortion detector 202.

In one embodiment, the invention is implemented in computer software. Far-end signal x(n) and microphone signal y(n) are sampled values in digital form stored in memory locations. Distortion detection is performed by comparing the values of far-end signal x(n) and microphone signal y(n) to memory locations containing threshold values that are indicative of saturation. Adapt control logic 203 is a logical OR function that sets a DISTORTION flag (i.e. a bit in a memory location) when a saturation threshold value is exceeded. Conventional digital signal processing techniques can also be used to detect distortion. The DISTORTION flag is taken into consideration by model 121, which can be implemented in software or in digital signal processing ("DSP") circuits, in determining whether to adapt its filter coefficients. Model 121 does not adapt when the DISTORTION flag is set and follows conventional adaptation rules when the DISTORTION flag is reset. Adder 122 is a summation function that generates error signal e(n) by summing microphone signal y(n) with echo estimate signal s(n) generated by model 121. If echo estimate signal s(n) is not provided in negative form, adder 122 takes the negative of echo estimate signal s(n) before summing it with microphone signal y(n). Distortion detectors, for example, can also be logic comparators that compare microphone signal y(n) to a threshold value. Coder 126 and decoder 125 can be implemented in computer software or by using an integrated circuit ("IC").

Figure 3:
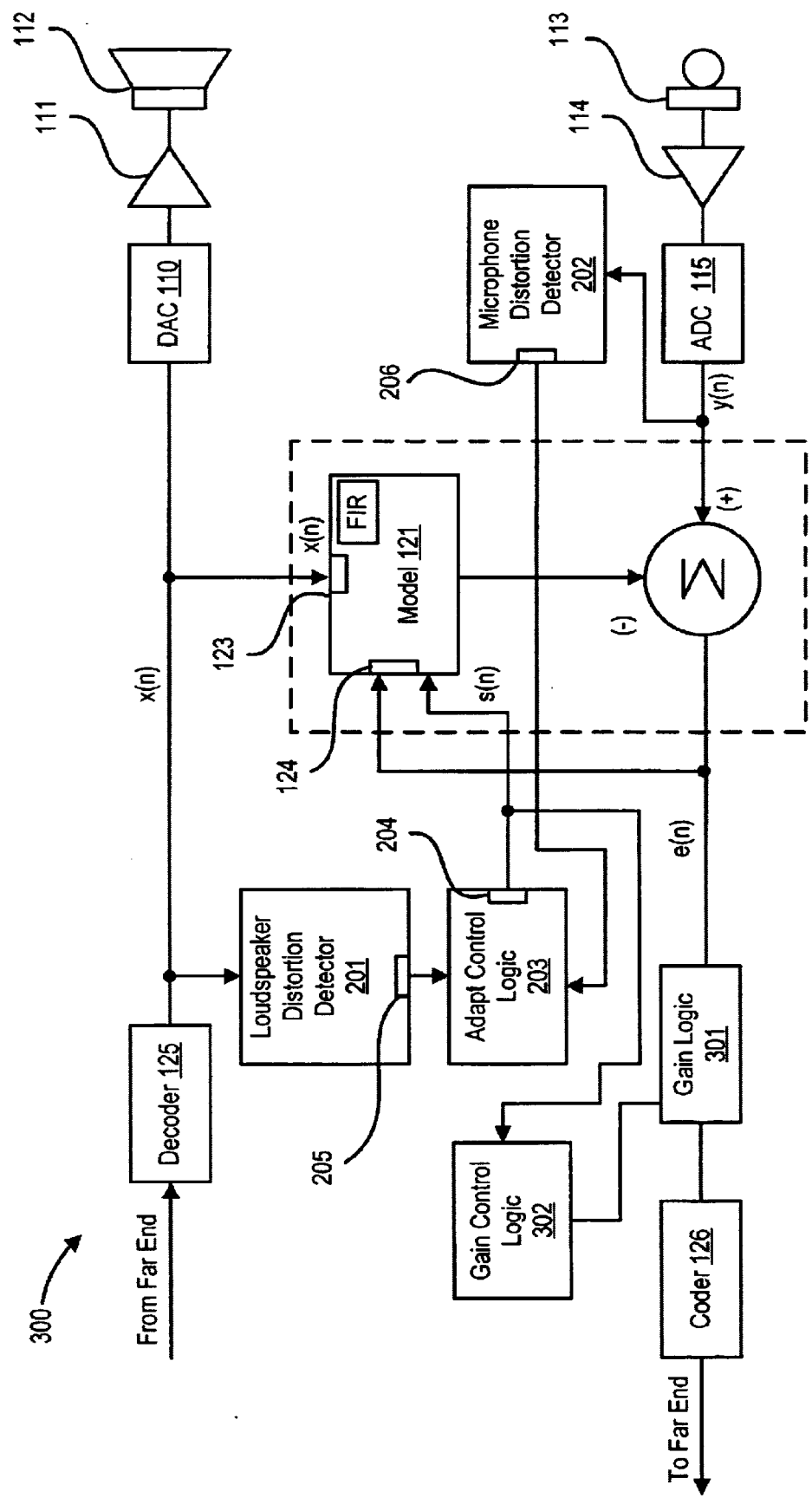
FIG. 3 shows a block diagram of an audio transmission system in accordance with another embodiment of the present invention.

FIG. 3 shows a block diagram of an audio transmission system 300 in accordance with an embodiment of the invention. Except for the addition of a gain logic 301 and a gain control logic 302, transmission system 300 is essentially identical to transmission system 200. Gain logic 301 changes the magnitude of error signal e(n) by a gain value (i.e. a multiplication factor) received from gain control logic 302. When adapt control logic 203 generates a logical HIGH signal, indicating that a distorted audio signal has been detected, gain control logic 302 lowers the gain of amplifier 301 to attenuate error signal e(n). This prevents residual echoes from propagating and also prevents further distortion of error signal e(n). Gain control logic 302 sets the gain of gain logic 301 based on the past history of audio signal levels, the maximum and minimum gain settings for a particular brand and model of microphone 113, and the optimum rate of changing the gain (based on previous experiments, for example).

The description of the invention given above is provided for purposes of illustration and is not intended to be limiting. Numerous variations are possible within the scope of the invention. The invention is set forth in the following claims.

What is claimed is:

1. A method for controlling an echo canceler having a plurality of settings comprising:
   determining that a first signal is distorted if the first signal exceeds a distortion threshold; and,
   causing said echo canceler not to change said settings when said first signal is distorted.

2. The method of claim 1 wherein said echo canceler is an acoustic echo canceler and said first signal is an audio signal.

3. The method of claim 2 wherein said settings are adaptive filter coefficients.

4. The method of claim 2 wherein said echo canceler is a sub-band acoustic echo canceler.

5. The method of claim 2 further comprising:

determining whether a second signal is distorted, said second signal being an audio signal; and causing said echo canceler not to change said settings when said second signal is distorted.

6. The method of claim 5 wherein said second signal is an audio signal from a remote location and said first signal is an audio signal from a local microphone.

7. The method of claim 2 further comprising:

changing the magnitude of said first signal when said first signal is distorted.

8. A digital audio processing system comprising:

a plurality of memory locations containing data representing an audio signal;

an acoustic echo canceler having a plurality of settings; and a distortion detector reading the contents of said plurality of memory locations and detecting distortion in said audio signal, said distortion detector being coupled to said acoustic echo canceler to cause said acoustic echo canceler not to adjust said settings when distortion is detected in said audio signal.

9. The system of claim 8 wherein said distortion detector is implemented in computer software.

10. The system of claim 8 wherein said distortion detector comprises logic circuitry.

11. The system of claim 8 further comprising:

a logic circuit for changing the magnitude of said first audio signal.

12. The system of claim 8 wherein said audio signal is from a remote location.

13. The system of claim 8 wherein said audio signal is from a local microphone.

14. A communication system for communicating audio information between a near-end and a far-end, the communication system comprising:

a near-end microphone operable to convert near-end sounds into a near-end signal;

a far-end microphone operable to convert far-end sounds into a far-end signal;

a near-end speaker in communication with the far-end microphone and operable to convert the far-end signal into a near-end sound;

a far-end speaker in communication with the near-end microphone and operable to convert the near-end signal into a far-end sound;

an acoustic echo canceller associated with the near-end, the acoustic echo canceller having adaptive settings and operable to adapt the settings to changing echos; and a distortion detector in communication with the acoustic echo canceller, the distortion detector operable to detect a distorted signal having a value above a predetermined distortion threshold and to disable the acoustic echo canceller from adapting settings with the distorted signal.

15. The communication system of claim 14 wherein the distortion detector compares the near-end signal against the predetermined distortion threshold and disables the acoustic echo canceller from adapting settings if the near-end signal exceeds the distortion threshold.

16. The communication system of claim 15 the predetermined distortion threshold comprises a sound having a sound level in excess of the ability of the near-end microphone to accurately represent the sound.

17. The communication system of claim 14 wherein the distortion detector compares the far-end signal against the predetermined distortion threshold and disables the acoustic echo canceller from adapting settings if the far-end signal exceeds the distortion threshold.

18. The communication system of claim 14 further comprising digital analog converter operable to convert the near-end signal into a digital signal and wherein the distortion detector is implemented in software.

19. The communication system of claim 14 wherein the predetermined threshold comprises a predetermined sound magnitude.

* * * * *